Figure 1:
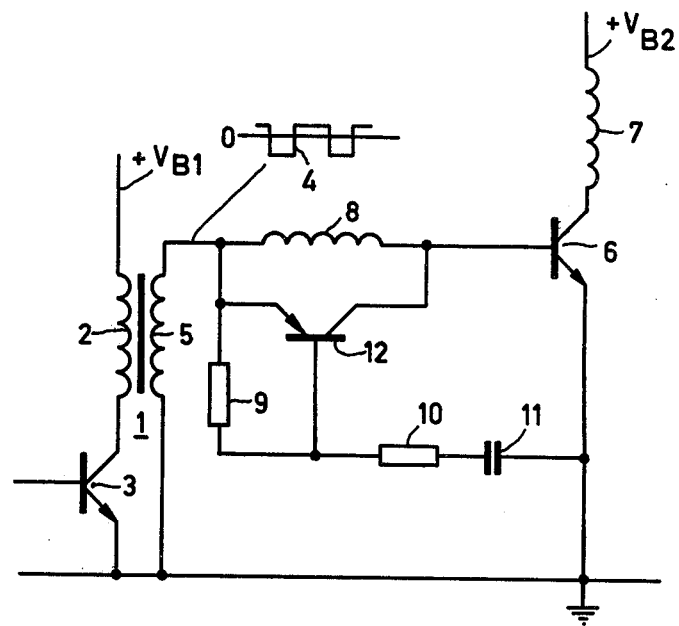

United States Patent [19]

Van Schaik et al.

[11] 4,200,813
[45] Apr. 29, 1980

[54] CIRCUIT ARRANGEMENT COMPRISING A HIGH-VOLTAGE POWER TRANSISTOR

[75] Inventors: Gerrit P. J. Van Schaik; Wim Bosboom, both of Nijmegen, Netherlands

[73] Assignee: U.S. Philips Corporation, New York, N.Y.

[21] Appl. No.: 859,660

[22] Filed: Dec. 12, 1977

[30] Foreign Application Priority Data

Dec. 15, 1976 [NL] Netherlands ............... 7613894

[51] Int. Cl.$^2$ ............................................. H03K 3/33
[52] U.S. Cl. .................................... 307/300; 307/254; 307/280
[58] Field of Search .............. 307/300, 280, 254; 315/27, D1, 403

[56] References Cited

U.S. PATENT DOCUMENTS

| | | | |
|---|---|---|---|
| 3,757,144 | 9/1973 | Hellerscheid et al. | 307/300 |
| 3,840,755 | 10/1974 | Benner et al. | 307/300 |

OTHER PUBLICATIONS

IBM Tech. Dsclre. Bttn., Turn Off Circuit, D. E. Norton, vol. 7, No. 6, 11/64.

*Primary Examiner*—Stanley D. Miller, Jr.
*Assistant Examiner*—B. P. Davis
*Attorney, Agent, or Firm*—Thomas A. Briody; William J. Streeter; Bernard Franzblau

[57] ABSTRACT

A high speed transistor switching circuit includes an inductor connected in the transistor base lead for reducing the switch-off time of the transistor. A controllable switch, e.g. a second transistor, is connected in parallel with the inductor for briefly short-circuiting the inductor when the first transistor is switched on thereby reducing the transistor switch-on time.

14 Claims, 2 Drawing Figures

CIRCUIT ARRANGEMENT COMPRISING A HIGH-VOLTAGE POWER TRANSISTOR

The invention relates to a circuit arrangement comprising a high-voltage power transistor having a thick collector layer, control means which are connected through an inductor to the base-emitter circuit of the transistor for supplying a pulse-shaped switching signal thereto and a load impedance connected to the collector of the transistor and to a supply voltage source, the current supplied by the voltage source to the collector of the transistor, which is driven to the saturation state, being interruptable under the influence of the pulse-shaped switching signal.

Such a circuit arrangement is known from U.S. Pat. No. 3,631,314 and is further explained in the publication "Electronic applications bulletin", Vol. 33, No. 2, pages 59 to 72 inclusive. Said inductor is provided for rapidly interrupting the collector current by causing the change of the inverse base current to be limited until the transistor is brought out of the saturation state. If the transistor is used in circuit arrangements in which the collector current must gradually increase on switch-on of the transistor then this measure will hardly cause any difficulties. Such a case is found inter alia in the line deflection circuit of television receivers wherein said transistor functions as a switch and conveys the line deflection current during the second half of the line trace period, which current is at first zero.

However, in other applications the collector current must fairly rapidly assume a high value when the transistor is switched on again. This situation is, for example, found in d.c. voltage converters in which an input d.c. voltage is converted into an output d.c. voltage by means of a switching transistor which is alternately brought into the conducting and into the non-conducting state by a switching signal. From the above-mentioned publication it appears that a current pulse of a fairly large amplitude and with a steep leading edge is required for optimum switch-on properties. Because the presence in the base lead of the inductor, which is required for a satisfactory switching off operation, delays the increase of the switch-on current, which may result in a large dissipation, it is proposed in said publication to shunt the inductor and a RC-parallel network, which may be arranged in series therewith for further improving the switching off, by a series arrangement consisting of a diode and a RC parallel network. Said diode has such a conductivity direction that the forward base current (when the transistor is conducting) can flow therethrough while the inverse base current (when the transistor does not conduct) cannot flow through it. The RC parallel network ensures a steep current pulse.

The measure proposed does not offer a solution which is satisfactory in all circumstances. This can be seen as follows. Approximately at the same instant during switch-off at which the inverse base current assumes its maximum value, the energy stored in the inductor causes an increase in the inverse base voltage. With a sufficiently high inductance value this energy is large enough to raise the base voltage to and maintain it at the value of the breakdown voltage of the base-emitter layer while the base current decreases again. At the instant at which the base current becomes zero the base voltage assumes the value of the switching voltage supplied by the control means. If now, as stated above, a diode is provided and if the breakdown voltage exceeds the sum of the switching voltage, the voltage across the RC-network and the anode-cathode voltage of the diode in the conducting state, then the diode starts conducting as soon as the base voltage has become equal to the said sum and the base voltage continues to retain this value. The diode short-circuits the inductor and the energy stored therein causes a short-circuit current which flows through the diode. The base current rapidly becomes zero. A large number of charge carriers is, consequently, not removed from the collector layer so that the collector current continues flowing for a longer time than was otherwise the case. So, providing the diode results in a prolongation of the switch-off time of the transistor which results in a considerably higher switch-off dissipation. This effect becomes worse in proportion as the breakdown voltage increases.

It is obvious that an improvement can be achieved by means of a higher switching voltage. However, this implies that the control means must be able to supply more energy. In addition, if these means comprise a driver transformer to the secondary side of which the present circuit arrangement is connected then this transformer is more expensive while the switching voltage required for switching on the transistor is correspondingly higher, which causes the base current to be greater during the time the transistor conducts. This increases the dissipation.

It is an object of the invention to provide a circuit arrangement in which it is ensured that with a few additional components both switch-off and switch-on of the high voltage power transistor takes place in an optimum manner and the circuit arrangement according to the invention is to this end characterized in that a controllable switch is connected in parallel with the inductor for briefly short-circuiting the said inductor at switch-on of the transistor.

Figure 2:
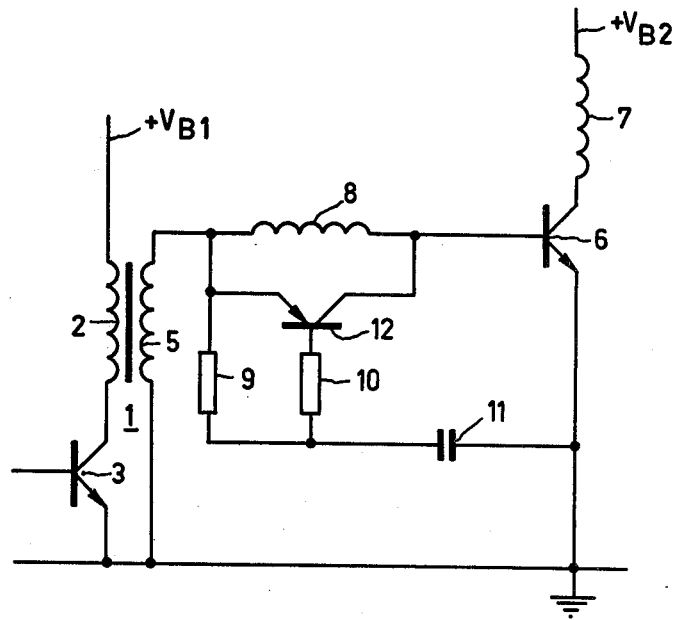

The invention will be further explained by way of non-limitative example with reference to the accompanying drawing. In the drawing:

FIG. 1 and FIG. 2 show embodiments of the switching arrangement according to the invention.

In the circuit arrangement of FIG. 1 reference numeral 2 is a primary winding of a driver transformer 1. The winding 2 is connected on the one hand to the collector of an npn driver transistor 3 and on the other hand to the positive terminal of a voltage source which supplies a voltage $V_{B1}$, the negative terminal of which is connected, as is the emitter of transistor 3, to the chassis. A pulse-shaped voltage which is derived from an oscillator, not shown, is supplied to the base of transistor 3. A secondary winding 5 of transformer 1 is connected in a manner which will be further explained between the base and the emitter of a high voltage power transistor 6 of the npn-type. The emitter thereof is connected to the chassis while the collector is connected through a winding 7 to the positive terminal of a voltage source, which supplies a voltage $V_{B2}$, the negative terminal of which is also connected to the chassis. Winding 7 is a primary winding of a transformer, not shown, which is part of a d.c. voltage converter of a known type which produces one or more d.c. voltages which are stabilized against variations in voltage $V_{B2}$, for example for feeding circuits in a television receiver. This stabilization is obtained in known manner, for example by means of a phase shift, depending on the voltage $V_{B2}$, of one of the edges of the pulse-shaped voltage which is supplied to the base of transistor 3.

Control means 1,3 pass said pulse-shaped voltage to the input electrodes of transistor 6. Transistor 6 should be brought to the non-conducting state by the falling edge of the secondary voltage 4 present at winding 5 and to the conducting state by the rising edge thereof.

A coil 8 is included between winding 5 and the base of transistor 6, while the series arrangement of two resistors 9 and 10 and a capacitor 11 is provided in parallel with winding 5. The emitter of a pnp-transistor 12 is connected to the junction of winding 5, coil 8 and resistor 9, while the collector is connected to the base of transistor 6 and the base to the junction of resistors 9 and 10.

At the instant at which the rising edge of voltage 4 occurs a current flows through resistors 9 and 10 and capacitor 11. This causes the capacitor to start to be charged positively and the voltage present at the junction of resistor 9 and 10 is such that transistor 12 conducts so that coil 8 is short-circuited by its collector-emitter path. The collector current of transistor 12 flows to the base of transistor 6 and brings it to the conducting state. The collector current of transistor 6 flows through winding 7. So by introducing transistor 12 it is ensured that the switch-on current has the desired amplitude and the desired rapid variation.

After a time which depends on the time constant of network 10, 11 the charging current of capacitor 11 has become so small that transistor 12 becomes non-conducting. However, the reduction in conductivity of transistor 12 takes place gradually so that a resistor of increasing value can be imagined to be in parallel with coil 8. Consequently the base current of transistor 6 is gradually taken over to an increasing extent by the coil. When transistor 12 is cut off, the entire base current of transistor 6 flows through coil 8 and is substantially not impeded.

At the instant at which the falling edge of voltage 4 occurs, a current flows again through resistors 9 and 10 and capacitor 11, which first discharges the capacitor and charges it negatively thereafter. Transistor 12 remains cut off and switch-off of transistor 6 occurs in known manner.

It is a condition for proper operation that the time constant of network 10, 11 is long enough to guarantee that the take-over of the forward base current by the coil takes place gradually. With a converter for which the frequency of switching voltage 4 was the television line frequency (that is to say approximately 15 kHz) it appeared that a time constant of approximately 1 to 2 $\mu$s was sufficient. The inductance value of coil 8 was approximately 5 $\mu$H. The value of resistor 9 is less important as this resistor is rapidly short-circuited by the conducting base-emitter diode of transistor 12.

FIG. 2 is a variant of FIG. 1 wherein resistor 10 is included between the base of transistor 12 and the junction of the interconnected resistor 9 and capacitor 11. It will be obvious that the operation of this arrangement is the same as that of FIG. 1. In a practical application as indicated above the capacitance of capacitor 11 was approximately 10 nF in FIG. 2 whereas resistors 9 and 10 had values of approximately 470 and 100 ohms, respectively.

Transistor 12 must only meet the requirement that it has a low saturation voltage. It is true that its collector current is rather high but this current flows during a very short period of time.

It will be noted that the circuit arrangement described may comprise in known manner a parallel RC network which is included in series either with winding 2 or with winding 5.

What is claimed is:

1. A circuit arrangement comprising a high-voltage power transistor having a base-emitter circuit and a collector layer, an inductor, control means connected through the inductor to the base-emitter circuit of the transistor for supplying a pulse-shaped switching signal thereto so as to drive the transistor between the saturation and cut-off states, a load impedance connected to the collector of the transistor and to a supply voltage source so that the current supplied by the voltage source to the collector of the transistor in the saturation state is interrupted under the influence of the pulse-shaped switching signal, and a controllable switch connected in parallel with the inductor so as to briefly short-circuit said inductor at switch-on of the transistor.

2. A circuit arrangement as claimed in claim 1, wherein the controllable switch comprises an auxiliary transistor whose collector-emitter path is in parallel with the inductor.

3. A circuit arrangement as claimed in claim 2, further comprising a series arrangement of a first resistor, a second resistor and a capacitor connected between a terminal of the inductor remote from the base of the high-voltage power transistor and a point of reference potential, and means connecting a junction of the resistors to the base of the auxiliary transistor.

4. A circuit arrangement as claimed in claim 2, further comprising a series arrangement of a first resistor and a capacitor connected between a terminal of the inductor remote from the base of the high-voltage power transistor and a point of reference potential, and a second resistor connected between the base of the auxiliary transistor and a junction between the first resistor and the capacitor.

5. A circuit arrangement as claimed in claim 3 or 4 wherein the frequency of the switching signal is of the order of 15 kHz, and the time constant of the network constituted by the second resistor and the capacitor is approximately 1 to 2 $\mu$s.

6. A circuit arrangement as claimed in claim 1 wherein the controllable switch comprises an auxiliary transistor in parallel with the inductor as seen from a pair of output terminals of the control means and connected so that the collector current of the auxiliary transistor flows through the base-emitter circuit of the power transistor during at least a part of the conduction period of the power transistor.

7. A circuit for switching a high-voltage power transistor between a saturation condition and a cut-off condition comprising, a source of supply voltage, an inductor, signal control means coupled to the base-emitter circuit of the transistor via said inductor for supplying thereto a pulse-shaped switching signal of a magnitude to drive the transistor alternately into saturation and cut-off, a load impedance coupling the transistor collector to said supply voltage source, a controlled unidirectional switch connected in parallel with the inductor and in series with the base-emitter circuit of the transistor and polarized in the same direction as the transistor base-emitter junction, and means coupled to a control electrode of the switch for controlling the switch into conduction in synchronism with the switching signal so as to effectively short-circuit the inductor for a given period during which the transistor is switched on by the switching signal.

8. A switching circuit as claimed in claim 7 wherein said switch conduction controlling means includes means for limiting the conduction period of the switch to a time period that is shorter than the conduction period of the power transistor in response to said switching signal.

9. A switching circuit as claimed in claim 7 wherein said switch comprises a second transistor and the switch conduction controlling means includes an RC circuit coupled to the base of the second transistor so as to gradually reduce the flow of base current therein after the power transistor is switched on whereby the conduction period of the second transistor is shorter than the conduction period of the power transistor.

10. A switching circuit as claimed in claim 8 wherein said limiting means includes an RC circuit coupled to a control electrode of the switch and coupled to said signal control means.

11. A switching circuit as claimed in claim 7 wherein the switch comprises a second transistor and the switch conduction controlling means includes a series RC circuit coupled to the signal control means and to a control electrode of the second transistor so as to limit the conduction period of the second transistor to a period that is shorter than the power transistor conduction period.

12. A switching circuit as claimed in claim 7 wherein the switch comprises a second transistor and the switch conduction controlling means includes a resistor and a capacitor serially connected between a terminal of the inductor remote from the base of the power transistor and a point of reference potential and coupled to the second transistor so that the base current of the second transistor flows into the capacitor.

13. A switching circuit as claimed in claim 7 wherein the switch comprises a second transistor and the switch conduction controlling means includes a first resistor and a capacitor serially connected between a terminal of the inductor remote from the base of the power transistor and a point of reference potential, and a second resistor connected between the base of the second transistor and a junction between the first resistor and the capacitor.

14. A switching circuit as claimed in claim 7 wherein said signal control means includes a transformer having a primary winding coupled to a source of pulse-shaped signals and a secondary winding coupled to the base-emitter circuit of the power transistor via said inductor.

* * * * *